(12) United States Patent
Komatsuda

(10) Patent No.: US 6,249,382 B1
(45) Date of Patent: Jun. 19, 2001

(54) ILLUMINATION OPTICAL SYSTEM AND PROJECTION EXPOSURE APPARATUS USING SAME

(75) Inventor: Hideki Komatsuda, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/340,236

(22) Filed: Jul. 1, 1999

(30) Foreign Application Priority Data

Jul. 3, 1998 (JP) ................................................. 10-204428

(51) Int. Cl.[7] .............................. G02B 27/10; G02B 3/00
(52) U.S. Cl. ............................................ 359/618; 359/649
(58) Field of Search ................................... 359/618, 619, 359/649; 355/67, 71; 326/268

(56) References Cited

U.S. PATENT DOCUMENTS

| | | | |
|---|---|---|---|
| 4,497,015 | 1/1985 | Konno et al. | 362/268 |
| 4,918,583 | 4/1990 | Kudo et al. | 362/268 |
| 5,581,605 | 12/1996 | Murakami et al. | 378/84 |
| 5,640,284 | 6/1997 | Tanitsu et al. | 359/869 |
| 5,967,319 * | 2/1999 | Sugiyama et al. | 359/618 |
| 6,049,374 * | 4/2000 | Komatsuda et al. | 355/67 |
| 6,084,655 * | 7/2000 | Suzuki et al. | 355/53 |
| 6,094,305 * | 7/2000 | Shiraishi | 359/558 |
| 6,100,961 * | 8/2000 | Shirashi et al. | 355/67 |
| 6,117,598 * | 9/2000 | Imai | 430/22 |
| 6,118,516 * | 9/2000 | Irie et al. | 355/53 |
| 6,127,095 * | 10/2000 | Kudo | 430/311 |
| 6,154,270 * | 11/2000 | Ozawa | 355/53 |

FOREIGN PATENT DOCUMENTS 6-97047  4/1994  (JP) .

* cited by examiner

*Primary Examiner*—Georgia Epps
*Assistant Examiner*—Saeed Seyrafi
(74) *Attorney, Agent, or Firm*—Oliff & Berridge PLC

(57) ABSTRACT

An illumination optical system and projection exposure apparatus (100) using same. The illumination optical system includes a predetermined conjugate plane (A) optically conjugate with respect to a mask (M) to be illuminated. The system also includes a first optical system arranged between alight source (114) and the conjugate plane and having a first optical axis (AZ1), and a second optical system arranged between the conjugate plane and the mask and having a second optical axis (AZ2). The second optical axis is shifted with respect to the first optical axis, at the conjugate plane. An optical integrator (140, 216) is arranged within the first optical system and is capable of forming a plurality of light source images from light from the light source. The integrator is designed so as to illuminate the conjugate plane. The second optical system includes a condenser optical system (144, 160) designed so as to converge light from the conjugate plane and to illuminate the mask. In a different embodiment of the present invention, the illumination optical system is arranged along a single folded optical axis and includes one or more optical members for deflecting the light so that an off-axis illumination region (IR) at the mask can be realized.

26 Claims, 10 Drawing Sheets

ILLUMINATION OPTICAL SYSTEM AND PROJECTION EXPOSURE APPARATUS USING SAME

FIELD OF THE INVENTION

The present invention relates to an illumination optical system and a projection exposure apparatus using same, and more particularly relates to an illumination optical system used in the manufacture of semiconductor integrated devices and the like, and a projection exposure apparatus that uses same.

BACKGROUND OF THE INVENTION

Conventionally, a projection exposure apparatus that projects a mask pattern onto a wafer is constructed so that the optical axis of the illumination optical system and the optical axis of the projection optical system coincide. Initially, unevenness in the transmittance of the projection optical system and inclinations of the principal rays at the mask surface arise rotationally symmetric to the optical axis, at least from the standpoint of design. In addition, the illumination intensity distribution of the illumination optical system and the inclinations of the principal rays are also rotationally symmetric with respect to the optical axis. Accordingly, to achieve a high degree of exposure uniformity and spatial coherence uniformity, the optical axes of the projection optical system and the illumination optical system are generally made to coincide.

Projection optical systems that use a concave mirror have been under development in recent years for use in projection exposure apparatuses. Such systems allow for a reduced number of lenses. With reference to FIG. 1, there is shown a prior art projection optical system 10 comprising, in order along a folded optical axis AZ, a mask M having a pattern thereon (not shown), three lenses 14, 16, 18, a concave mirror 20, a first fold mirror MI, a fourth lens 24, a second fold mirror M2, an aperture stop AS, a fifth lens 26, and a wafer W.

A light beam L from an illumination optical system (not shown) is incident mask M. Light beam L emerging from mask M is transmitted through lenses 14, 16, 18 and is incident concave mirror 20. Light beam L reflected by concave mirror 20 is transmitted again through lens 18 and is incident mirror Ml. Light beam L reflected by mirror MI is transmitted through lens 24 and is incident mirror M2. Light beam L reflected by mirror M2 is transmitted through aperture stop AS and lens 26, and projects an image of the mask pattern onto wafer W. Light beam L incident concave mirror 20 and the light beam reflected therefrom must be separated in a projection optical system that uses a concave mirror. Accordingly, optical axis AZ cannot constitute part of the exposure region. With reference to FIG. 2, exposure region ER is shifted from optical axis AZ of projection optical system 10, and is only a portion of the entire possible exposure region 32.

In such prior art projection exposure apparatus having a projection optical system that uses a concave mirror, such as system 10, a comparatively high exposure uniformity and spatial coherence uniformity are easy to achieve from the viewpoint of design if the optical axes of the projection optical system and the illumination optical system are made to coincide. With reference now to FIG. 3, since the possible illumination region 36 of the illumination optical system is centered on optical axis AZ, illumination efficiency is extremely low. Thus, the entire possible illumination region 36 is extremely large compared with illumination region IR.

To increase illumination efficiency, the optical axis of the illumination optical system should be made to coincide with the center of illumination region IR. In other words, the optical axis AZ of projection optical system 10 and the optical axis of the illumination optical system should be shifted. However, as discussed earlier, this is difficult from the viewpoint of design.

The necessity to make the optical axes of the illumination optical system and the projection optical system coincide is now explained in greater detail.

With reference now to FIG. 4 and projection optical system 40 with principal rays B1, spherical aberration exists at the entrance pupil EP. Consequently, even if principal rays B1 are extended at mask M, they do not meet at one point, as can be seen by the broken lines in the figure. This type of spherical aberration is called pupil spherical aberration.

With reference now to FIG. 5, if projection optical system 40 is made telecentric on the mask M side, all of principal rays B I are not parallel to optical axis AZ due to the effect of pupil spherical aberration. Moreover, the degree of inclination from parallelism with optical axis AZ differs depending on the image height h.

With reference now to FIG. 6, projection optical system 40 used in combination with an illumination optical system 44 with an optical axis AI, an entrance pupil EP' and a condenser lens 46 to form a projection exposure apparatus. Because a high degree of spatial coherence uniformity is required in a projection exposure apparatus, exit pupil EP' must be such that for all image heights, h' an image of entrance pupil EP' is formed at the center of entrance pupil EP of projection optical system 40. Therefore, the exit pupils EP and EP' must be conjugate and also aberration free (e.g., no pupil spherical aberration). To satisfy these conditions, the principal ray at each image height h' of illumination optical system 44 viewed from mask M must be inclined in relation to the inclination of the principal ray of projection optical system 40.

Generally, since an optical system is designed to be rotationally symmetric about its optical axis, the inclinations of the principal rays, discussed earlier, are also set rotationally symmetric about the optical axis. Accordingly, if optical axis Al of illumination optical system 44 and optical axis AZ of projection optical system 40 do not coincide (FIG.6) then it becomes difficult, from the viewpoint of design, to make the inclination of the principal ray at each image height coincide.

If pupil spherical aberration can be corrected in the design, then optical axes AI and AZ do not necessarily need to coincide. However, it is required that projection optical system 40 be strictly conjugate with respect to mask M and wafer W, namely that it be aberration free. In addition, the correction of pupil spherical exacerbates difficulties in the design of the projection optical system. Furthermore, the manufacture of such a projection optical system is extremely difficult. As it is, the cost of the projection optical system is already high within the total cost of the projection exposure apparatus, and the above-described design issues unfortunately further increase the cost.

SUMMARY OF THE INVENTION

The present invention relates to an illumination optical system and a projection exposure apparatus using same, and more particularly relates to an illumination optical system used in the manufacture of semiconductor integrated devices and the like, and a projection exposure apparatus that uses same.

The present invention has the objective to provide an illumination optical system with high illumination efficiency and uniform exposure and spatial coherence, even for a projection optical system wherein the effective exposure range is shifted from the optical axis, and a projection exposure apparatus that uses same.

Accordingly, a first aspect of the invention is an illumination optical system for illuminating a surface. The apparatus comprises a predetermined conjugate plane optically conjugate with respect to the surface to be illuminated, a first optical system arranged between the light source and the conjugate plane and having a first optical axis, and a second optical system arranged between the conjugate plane and the surface to be illuminated and having a second optical axis. The second optical axis is shifted with respect to the first optical axis, at the conjugate plane.

A second aspect of the invention is an illumination optical system as described above, and further includes an optical integrator arranged within the first optical system and capable of forming a plurality of light source images from light from a light source, and designed so as to illuminate the conjugate plane. In addition, the second optical system includes a condenser optical system designed so as to converge light from the conjugate plane and to illuminate the surface.

A third aspect of the invention is an illumination optical system wherein there is a single folded optical axis. In this case, the apparatus includes one or more optical members for deflecting the light so that an illumination region can be formed at the surface to be illuminated that is removed from the optical axis. Such optical members include, for example, a wedge prism, first and second folding members, a stepshaped optical member, and a flyeye lens having non-parallel entrance-side and exit-side axes associated with the optical elements making up the flyeye lens.

A fourth aspect of the invention is a projection exposure apparatus for patterning a photosensitive substrate which incorporates the illumination optical system as described above, and a projection optical system designed and arranged so as to project a pattern on the mask onto the photosensitive substrate.

DETAILED DESCRIPTION OF THE INVENTION

The present invention relates to an illumination optical system and a projection exposure apparatus using same, and more particularly relates to an illumination optical system used in the manufacture of semiconductor integrated devices and the like, and a projection exposure apparatus that uses same.

Figure 1:
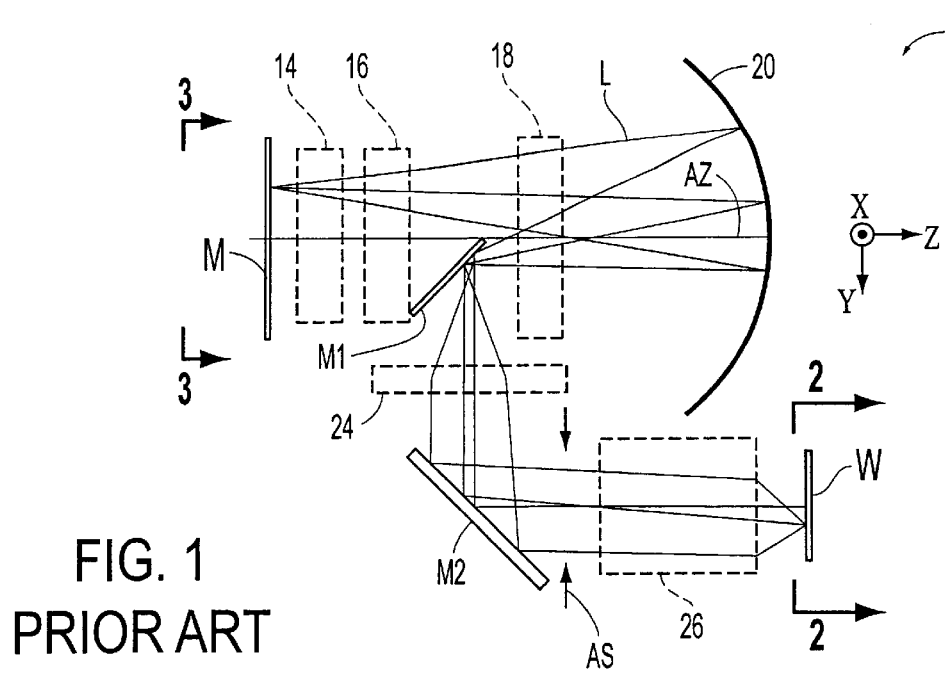
FIG. 1 is a schematic optical diagram of a prior art projection optical system having a concave mirror.
Figure 2:
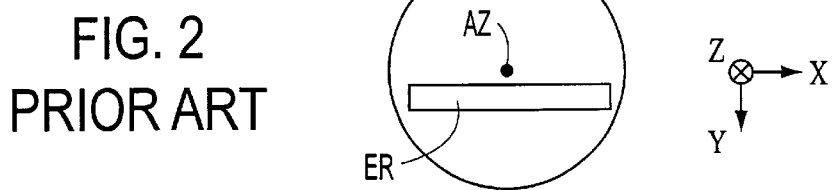
FIG. 2 is a cross-sectional view of the prior art projection optical system of FIG. 1 taken along the line 2—2, showing the positional relationship between the optical axis of the projection optical system and the exposure region.
Figure 3:
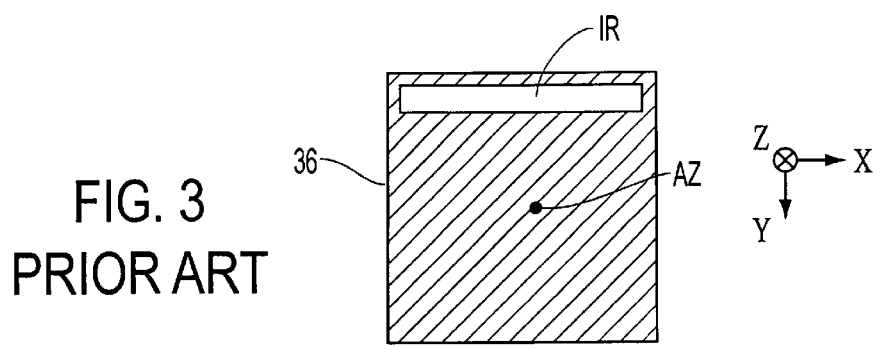
FIG. 3 is a cross-sectional view taken in the direction of the line 3—3 line in FIG. 1, showing the positional relationship between the optical axis of the projection optical system and the illumination region.
Figure 5:
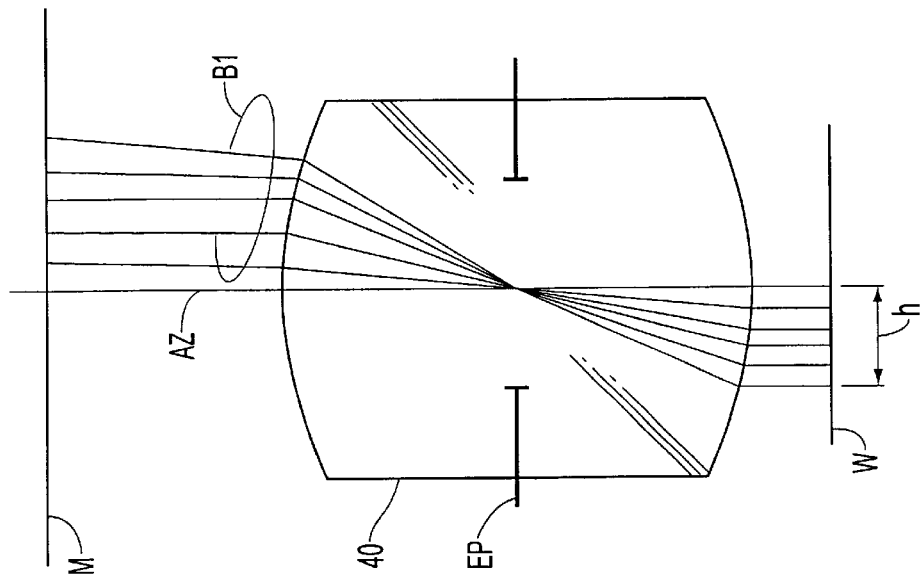
FIG. 5 is a schematic optical diagram of a telecentric projection optical system and principal rays associated with various image heights.
Figure 4:
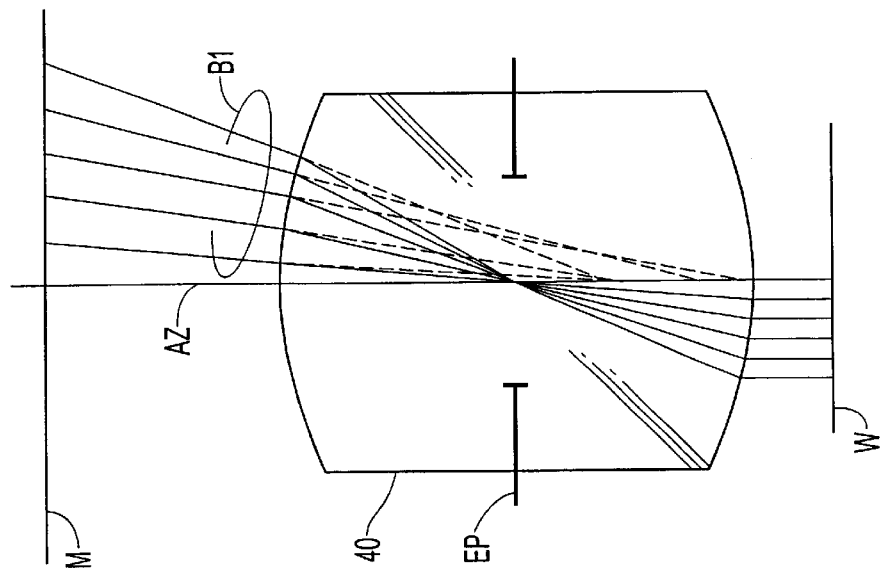
FIG. 4 is a schematic optical diagram of a projection optical system with pupil spherical aberration.
Figure 6:
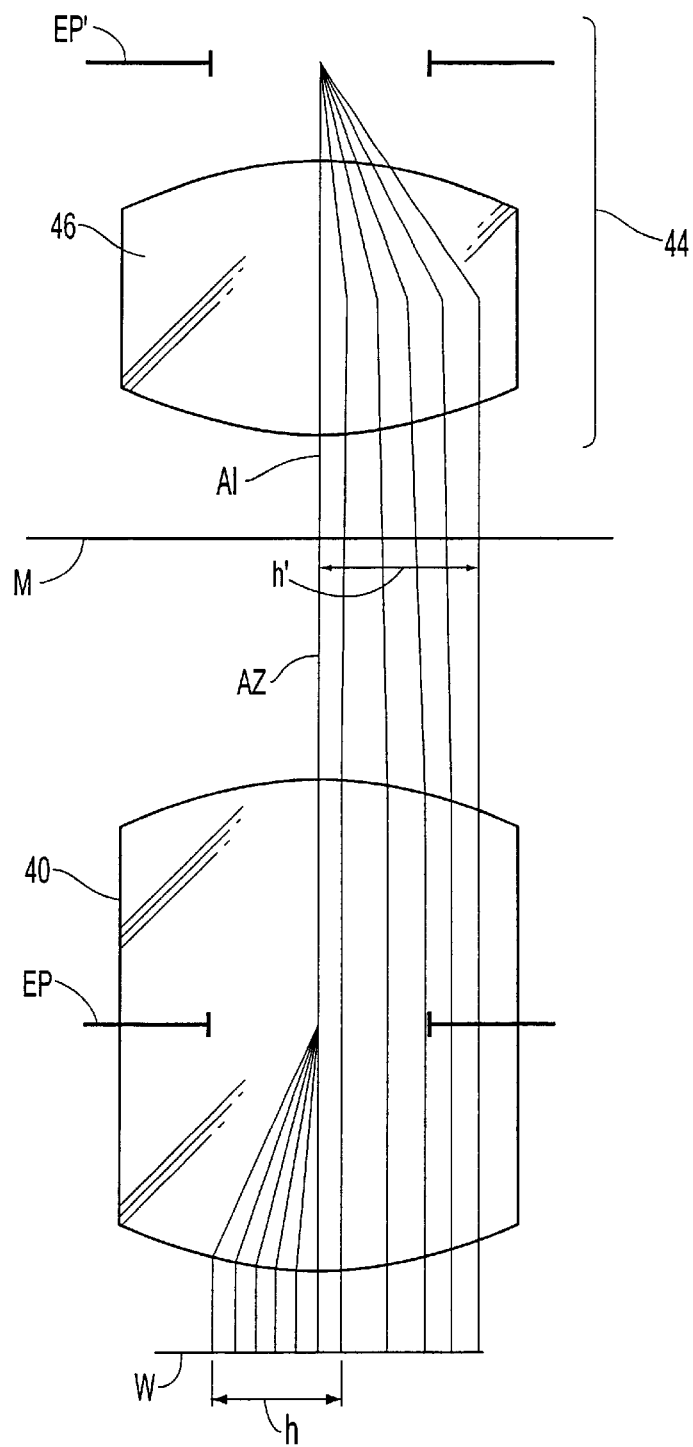
FIG. 6 is a schematic optical diagram of a telecentric projection exposure apparatus which includes an illumination optical system and a projection optical system.
Figure 7:
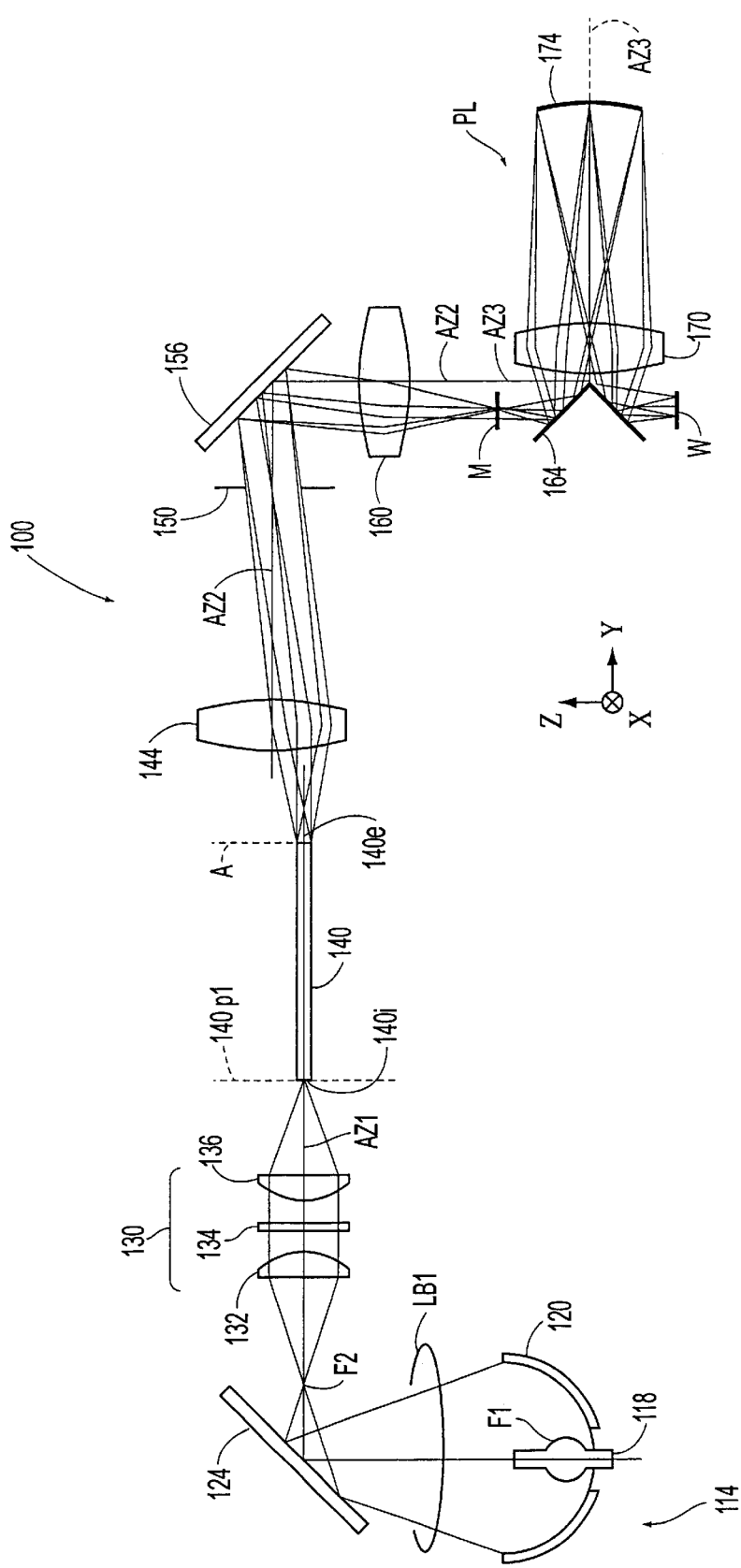
FIG. 7 is a schematic optical diagram of the projection exposure apparatus according to a first embodiment of the present invention.

With reference to FIG. 7, projection exposure apparatus 100 of the present invention comprises, in order along a folded optical axis AZ1, a light source 114 comprising a light bulb 118 and an elliptical mirror 120 having first and second focal points F1 and F2. Mirror 120 is arranged such that light bulb 118 is located at or near focal point F1. Apparatus 100 flirter includes a first fold mirror 124, a relay system 130 comprising a first relay lens 132, an interference filter 134 and a second relay lens 136, and a glass rod (i.e., light pipe) 140 having a light-source-wise entrance surface 140$i$ and an opposite end exit surface 140$e$. First and second planes 140P1 and A are respectively associated with surfaces 140$e$ and 140$i$ and are perpendicular to optical axis AZ1. Rod 140 serves as an optical integrator, as described below. First and second relay lenses 132 and 136 are arranged and designed such that second focal point position F2 is conjugate with entrance surface 140$i$ of glass rod 140.

Apparatus 100 further includes, in order along a second optical axis AZ2 offset from optical axis AZ1 and substantially parallel thereto, a first condenser lens 144, an aperture stop 150 for setting the NA of the illumination, a second fold mirror 156, a second condenser lens 160, a mask M, and a projection optical system PL. The latter comprises, along a folded optical axis AZ3, an orthogonal roof mirror 164, a lens 170, and a concave mirror 174. A wafer W is arranged adjacent projection lens PL conjugate to mask M. The elements in apparatus 100 from light source 114 to second condenser lens 160 constitute an illumination optical system. Also, first and second condenser lenses constitute a condenser optical system having a front focal plane (not shown). This condenser optical system may also be considered to include aperture stop 150 and second fold mirror 156.

With continuing reference to FIG. 7, the operation of apparatus 100 is now explained. A light beam LB1 is emitted from light source 114 and is converged to second focal point position F2 by elliptical mirror 120 and first fold mirror 124. Light beam LB1 is then transmitted through first relay lens 132, interference filter 134, and second relay lens 136, and then enters glass rod 140 at entrance surface 140i. The exposure wavelength is determined by interference filter 134, which passes one or more select wavelengths of light.

Light beam LB1 enters glass rod 140 forms a plurality of light source images, namely a real image and numerous virtual images (neither are shown) in plane 140P1, via internal reflection in glass rod 140. Exit end surface 140e of glass rod 140 is thus illuminated in a superimposed manner, as though the light from the plurality of light source images all exit from exit end surface 140e.

Light beam LB1 emitted from exit surface 140e of glass rod 140 is then transmitted through first condenser lens 144 and aperture stop 150, and then is incident second fold mirror 156. Light beam LB1 is reflected by second fold mirror 156, is then transmitted through second condenser lens 160, and is incident mask M. Thus, in the illumination optical system of projection exposure apparatus 100, a surface light source is formed by glass rod 140 and first condenser lens 144 at aperture stop 150. In addition, exit surface 140e of glass rod 140 is arranged at the front focal plane position of the condenser optical system. Further, exit surface 140e of glass rod 140 is optically conjugate with mask M. Furthermore, aperture stop 150 is arranged at a position conjugate to entrance surface 140i of glass rod 140.

With continuing reference to FIG. 7, light beam L that exits mask M is transferred onto wafer W by projection optical system PL. In addition, optical axis AZ3 of projection optical system PL and optical axis AZ2 of apparatus 100 coincide. This facilitates correcting various errors generated by the projection optical system. Also, since optical axes AZ1 and AZ2 are shifted relative to one another, illumination light LB1 can be supplied only to the illumination region spaced apart from optical axis AZ2. Accordingly, a projection exposure apparatus with high illumination efficiency can be provided.

Figure 8:
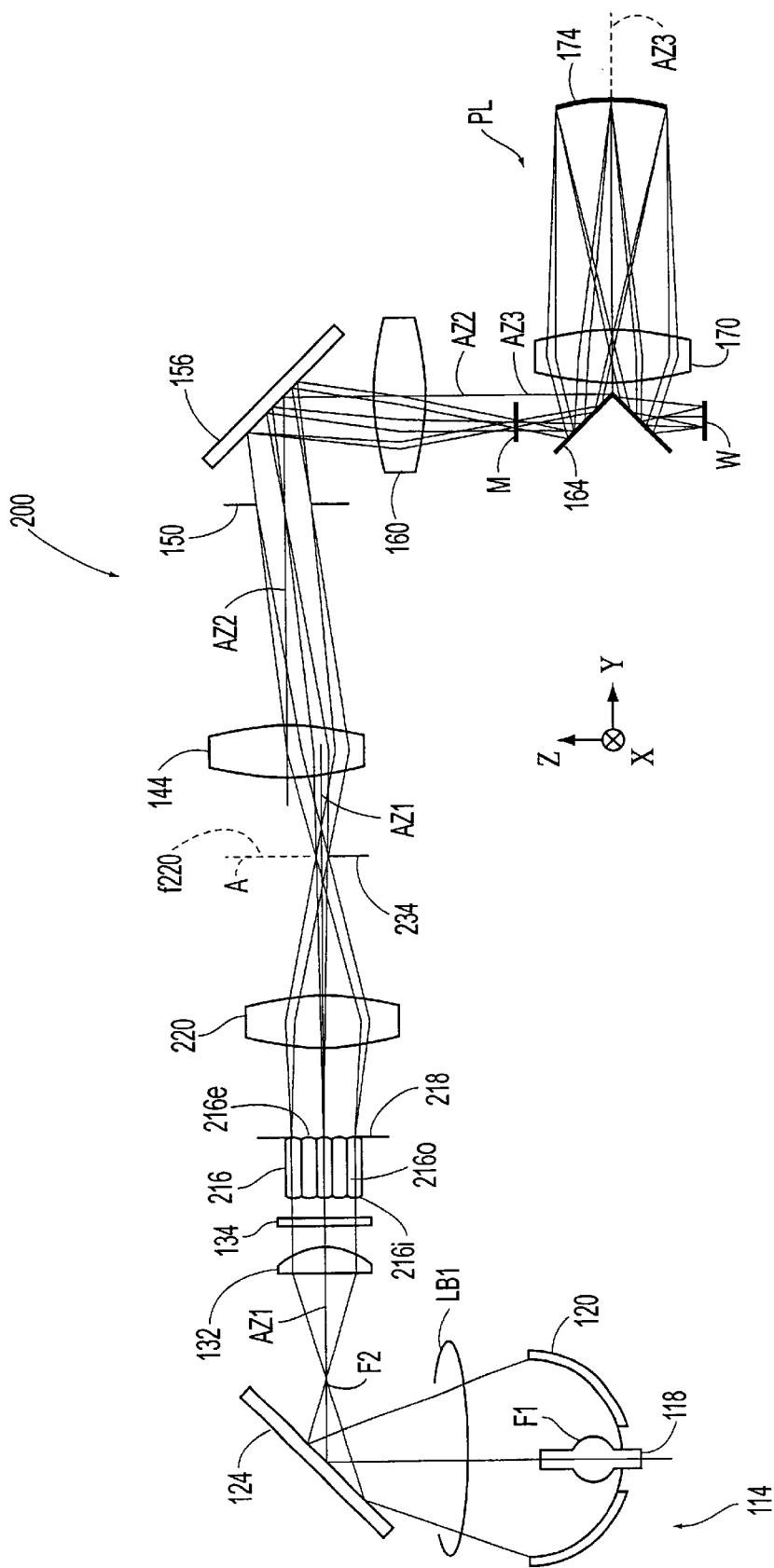
FIG. 8 is a schematic optical diagram of the projection exposure apparatus according to a second embodiment of the present invention.

With reference now to FIG. 8, a projection exposure apparatus 200 according to a second embodiment of the present invention is now described. As apparatus 200 is similar to apparatus 100 of FIG. 7, only the differences between the two are explained. Light beam LB1 passing through focal point F2 is incident relay lens 132, passes through filter 134, and is incident a flyeye lens 216 having an incident surface 216i, and an exit surface 216e. Flyeye lens 216 comprises a plurality of optical elements 216o. An aperture stop 218 is arranged immediately adjacent exit surface 216e and a collimator lens (collimator optical system) 220 having a focal plane f220 is arranged adjacent field stop 234. In addition, a field stop 234 is arranged between collimator lens 220 and first condenser lens 144, and is optically conjugate to mask M.

When light enters flyeye lens 216, a plurality of light source images corresponding in number to the number of optical elements 21 6o are formed in a plane perpendicular to optical axis AZ1 and co-planar with exit surface 216e. Accordingly, flyeye lens 216 acts as an optical integrator.

Light beam LB1 emitted from flyeye lens 216 is sequentially transmitted through aperture stop 218, collimator lens 220, a field stop 234 and first condenser lens 144. The light then passes through aperture stop 150 and then reflects from second fold mirror 156 and onto mask M. The light passing through mask M is ultimately imaged onto wafer W, as described above in connection with apparatus 100. Also, in the illumination optical system of projection exposure apparatus 200, a surface light source is formed at aperture stop 150 by flyeye lens 216.

In apparatus 200, flyeye lens 216 and collimator lens 220 function as a multiple light source forming means that uniformly illuminates field stop 234 at a position optically conjugate to mask M. Field stop 234 is arranged at the position of plane A, which is optically conjugate to mask M. Furthermore, entrance surface 216i of flyeye lens 216 is arranged at a position optically conjugate to mask M.

Also, as in apparatus 100, optical axes AZ1 and AZ2 are shifted and are parallel with respect to each other, allowing for a high illumination intensity to be achieved. Also, because, optical axes AZ2 and AZ3 coincide, it is easy to correct the various optical axis rotationally symmetric errors generated by projection optical system PL. If the various errors are corrected at field stop 234, it is quite possible to make a design even if optical axis AZ1 at field stop 234 is offset with respect to optical axis AZ2. It is generally preferred to correct relatively simple aberrations at first condenser lens 144 and second condenser lens 160, rather than with projection lens PL.

Figure 9:
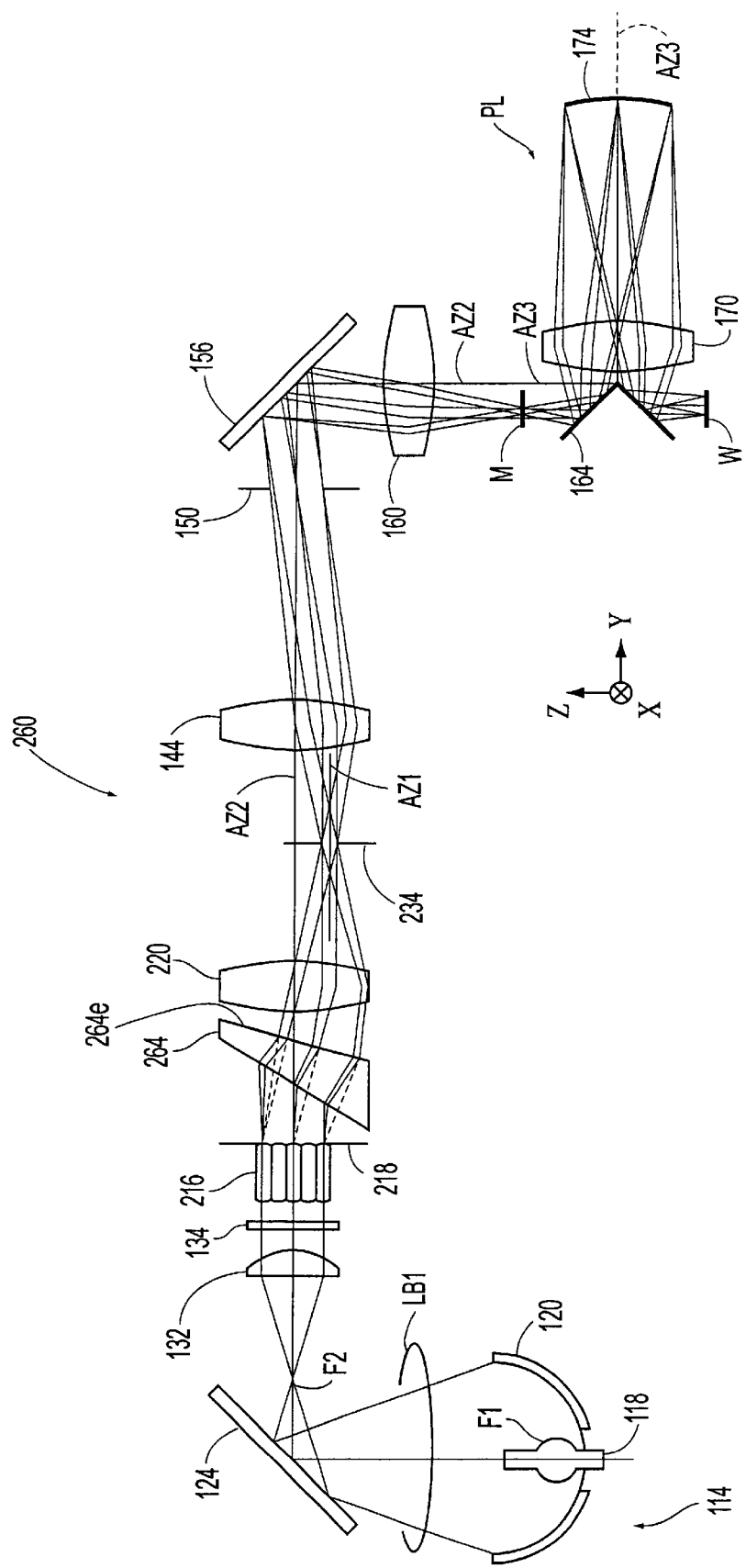
FIG. 9 is a schematic optical diagram of the projection exposure apparatus according to a third embodiment of the present invention.

With reference now to FIG. 9, projection exposure apparatus 260 according to a second embodiment of the present invention is now described. Apparatus 260 is similar to apparatus 200 of FIG. 8, except that apparatus 260 includes a wedge prism 264 having an exit surface 264e. Wedge prism 264 is arranged between flyeye lens 216 and collimator lens 220. Accordingly, light beam LB1 passing through second focal point position F2, is transmitted through relay lens 132 and interference filter 134, and then is incident flyeye lens 216, as in apparatus 200. However, in apparatus 260, light beam LB1 exiting flyeye lens 216 is transmitted through aperture stop 218 and is incident wedge prism 264. Light beam LB1 is then deflected by wedge prism 264 and is sequentially transmitted through collimator lens 220, field stop 234 having an off-axis aperture and first condenser lens 144, and then is incident mirror 156. Wedge prism 264 and collimater lens 220 thus act to offset optical axis AZ1 with respect to optical axis AZ2. Light beam LB1 is then reflected by mirror 156, is transmitted through second condenser lens 160, and then is incident mask M. Mask M is then imaged onto wafer W, as described above in connection with apparatus 100.

In projection exposure apparatus 260, a surface light source is formed on aperture stop 218 by flyeye lens 216, as in apparatus 200. Field stop 234 is arranged at a position conjugate to mask M. Aperture stop 218 is a Fourier transform plane, corresponding to mask M, due to its location at the pupil position of the illumination optical system. Furthermore, as in apparatus 200, optical axes AZ2 and AZ3 coincide.

If the trajectory of the light beam exiting exit surface 264e of wedge prism 264 is extended in the reverse direction, it converges at aperture stop 218, as shown by the broken lines in FIG. 9.

Since optical axes AZ2 and AZ3 coincide in apparatus 260, it is even easier to correct various optical axis rotationally symmetric errors generated by the projection optical system. However, since the horizontal direction and vertical direction of wedge prism 264 are asymmetric, attention must be paid to symmetry in both directions when implementing the design.

In each of the above described embodiments of the projection exposure apparatus of the present invention, light source 114 is depicted as an ultrahigh-pressure mercury lamp, which is capable of supplying g-line (436 nm) and i-line (365 nm) light. However, light source 114 is not so limited. For example, light source 114 may also be any one of a number of laser light sources, such as a KrF excimer laser that supplies 248 nm wavelength light, an ArF excimer laser that supplies 193 nm wavelength light or an $F_2$ laser that supplies 157 nm wavelength light. Furthermore, if the illumination optical system and projection exposure apparatus described in the above examples are constructed with a catadioptric system or a catoptric system, a charged particle beam, such as an X-ray beam, X-rays or an electron beam, can also be used as the light source. Use of a sufficiently narrow band light source may make interference filter 134 unnecessary.

Projection exposure apparatus 100, 200 and 260, described above, have optical axes AZ1 and AZ2 which are offset at conjugate plane A, which is optically conjugate with mask M. However, the present invention is not limited so such a geometry. The following describes several modified examples of the present invention.

Figure 10:
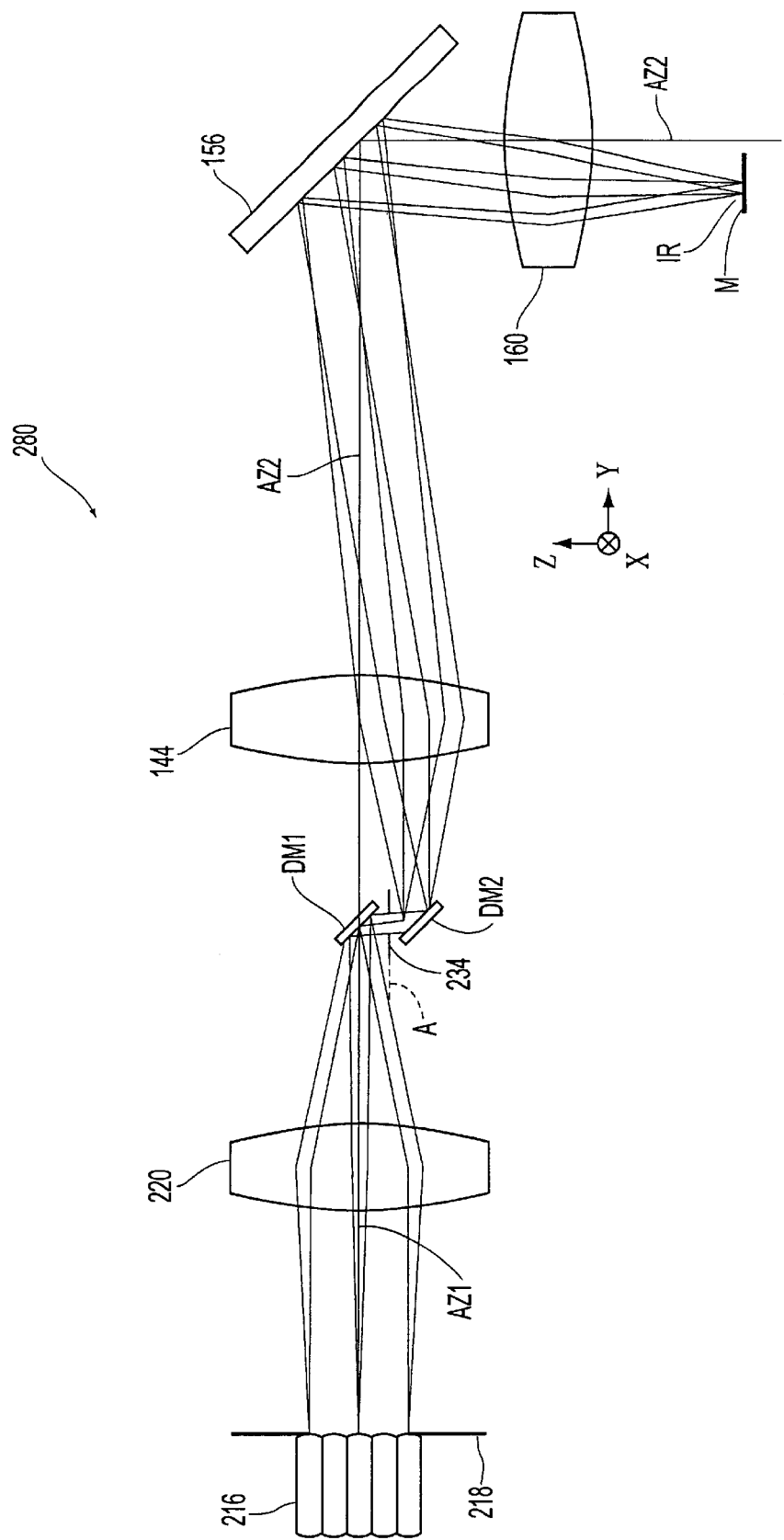
FIG. 10 is a schematic optical diagram of a first modified portion of the projection exposure apparatus of FIG. 8 (Modified Example 1) according to the present invention.

With reference now to FIG. 10, projection exposure apparatus 280 represents a first modification of apparatus 200 of FIG. 8. Apparatus 280 is similar to apparatus 200, except that the former includes two folding members DM1, DM2 arranged in the optical path between collimator lens 220 and first condenser lens 144. First folding member DM1 and second folding member DM2 are provided inclined with respect to the focal plane and are arranged mask-wise of collimator lens 220. Field stop 234 is arranged at plane A located between folding members DM1, DM2. This eliminates the need to directly offset optical axes AZ1 and AZ2 with respect to each other.

With continuing reference to FIG. 10, based on the above construction of apparatus 280, the light passing through collimator lens 220 is folded by first folding member DM1 in a direction that intersects (orthogonally) the optical axis and is guided to field stop 234 and to second folding member DM2 The light folded by second folding member DM2 then obliquely enters first condenser lens 144. As a result, an illumination region IR is formed at a predetermined position on mask M removed from optical axis AZ2.

Thus, it will be appreciated that any known means may be used to accomplish this effect, as long as it deviates optical axes AZ1 and AZ2 at conjugate plane A.

Figure 11:
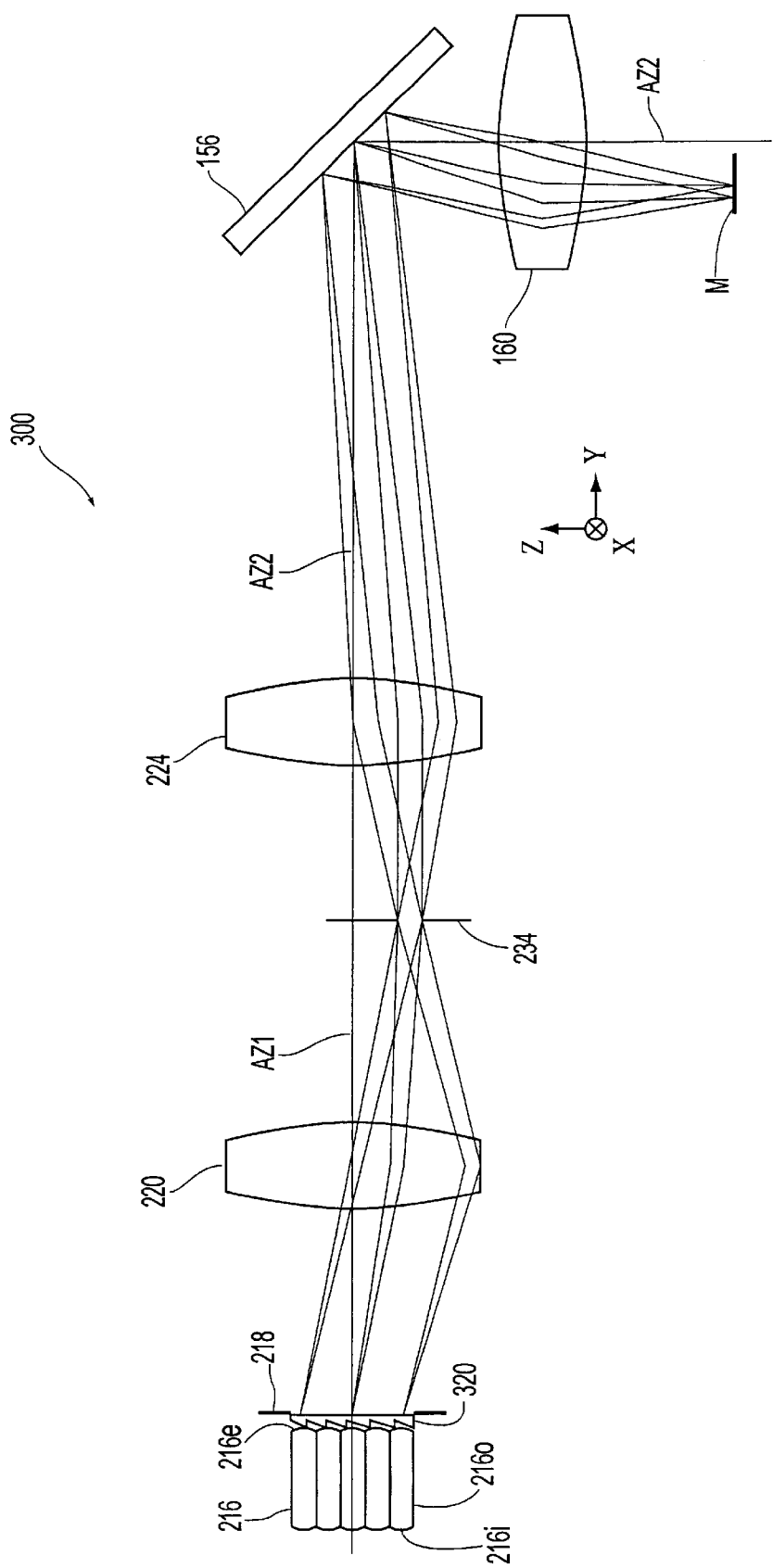
FIG. 11 is a schematic optical diagram of a second modified portion of the projection exposure apparatus of FIG. 8 (Modified Example 2) according to the present invention.

In projection apparatus 260 of FIG. 9, discussed above, wedge prism 264 acts as a folding member and is arranged mask-wise of aperture stop 218 in the Fourier plane of mask M. With reference now to FIG. 11, projection exposure apparatus 300 represents a second modification of apparatus 260. Rather than a wedge prism, apparatus 300 includes a step-shaped (or Fresnel lens shaped) optical member, such as folding prism 320 having a saw-tooth surface, as a folding member arranged between flyeye lens 216 and field stop 234.

Figure 12:
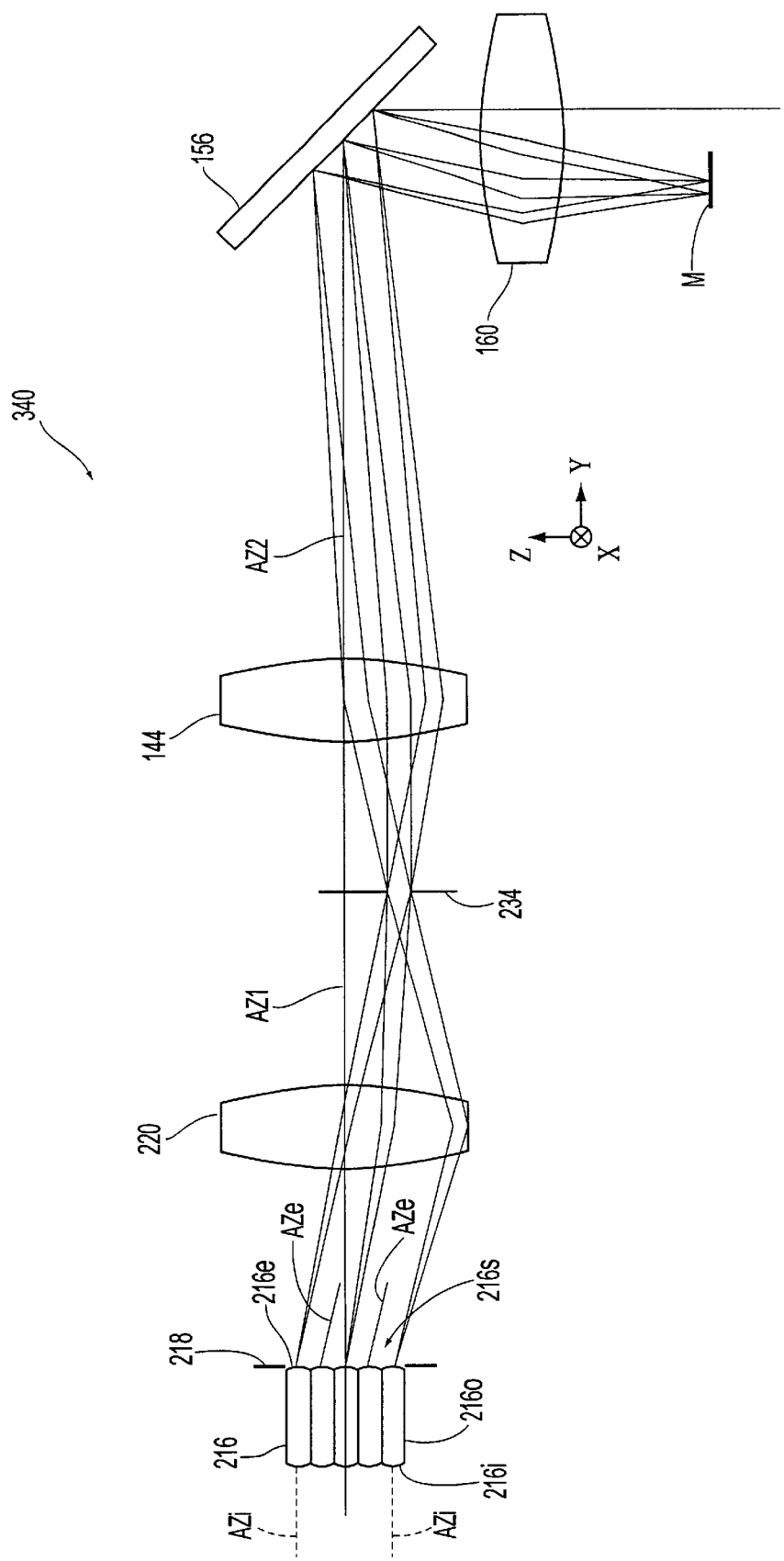
FIG. 12 is a schematic optical diagram of a third modified portion of the projection exposure apparatus of FIG. 8 (Modified Example 3) according to the present invention.

With reference now to FIG. 12, projection exposure apparatus 340 represents a third modification of apparatus 200. Apparatus 340 is constructed without wedge prism 264. In its place, there is a flyeye lens 216 designed to have incident optical axes AZi associated with each element 216o on incident side 216i, and exit optical axes AZe associated with each element 216o on exit side 216e, wherein axes AZi and AZe are oriented at an angle with respect to one another. This geometry deflects the light exiting flyeye lens 216 so that it intersect collimator lens 220 obliquely, as done in apparatus 300 using folding prism 320.

Figure 13:
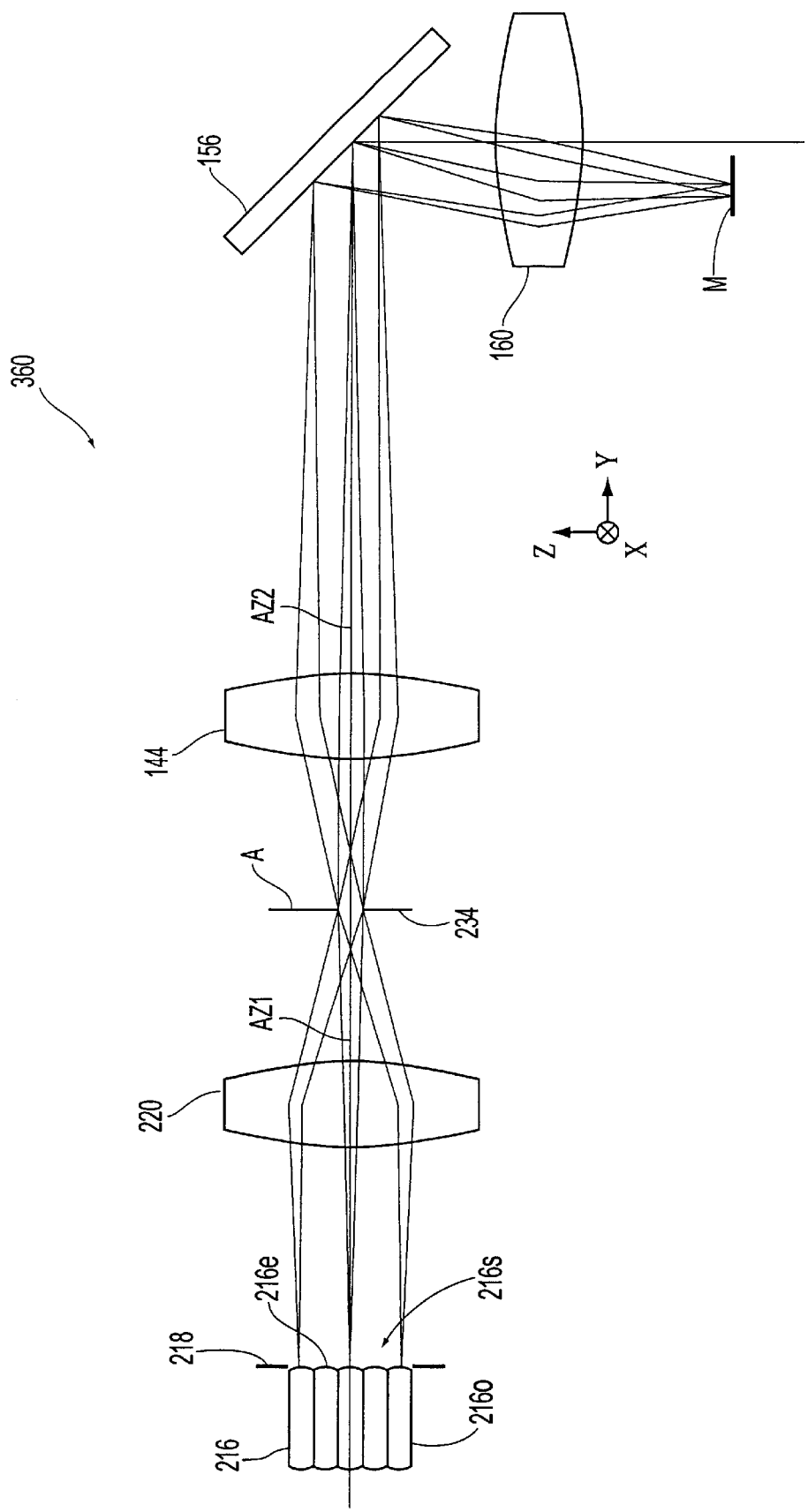
FIG. 13 is a schematic optical diagram of a fourth modified portion of the projection exposure apparatus of FIG. 8 (Modified Example 4) according to the present invention.

With reference now to FIG. 13, projection exposure apparatus 360 represents a fourth modification of apparatus 200. Apparatus 360 is constructed without wedge prism 264. However, second fold mirror 156 is arranged obliquely with respect to plane A so that the light passing through first condenser lens 144 is made to enter second condenser lens 160 obliquely. In this case, the optical members that constitute the illumination optical system are all coaxial (i.e., optical axis AZ1 and AZ2 coincide).

Thus, any known means may be used in apparatus 300, 340 and 360 of the present invention, as long as it is a means that assigns a predetermined angle to the travel direction of the light and to the direction of the optical axis of the subsequent optical system at the plane that is a Fourier transform plane of the mask.

The present invention described above can provide an illumination optical system with a high illumination efficiency with few errors in the uniformity of exposure and spatial coherence and the like, even for a projection optical system wherein the effective exposure region is shifted from the optical axis, and a projection exposure apparatus using same.

In exposure apparatus 100–360 of FIG. 7–FIG. 13, respectively, mask M is supported by a mask stage MS and wafer (photosensitive substrate) W is supported by a wafer stage (a substrate stage) WS. When mask stage MS and wafer stage (substrate stage) WS is moved along a predetermined direction (scanning direction) Y, the pattern image of mask M is exposed onto wafer (photosensitive substrate) W through projection optical system PL. In projection exposure apparatus 100 of FIG. 7 and 200 of FIG. 8, optical axes AZ1 and AZ2 are shifted along a direction corresponding with the scanning direction Y. In exposure apparatus 260–340 of FIG. 9–FIG. 12, respectively, optical axis AZ1 is shifted along a direction corresponding with the scanning direction Y by the deflecting unit (264, DM1, DM2, 216e).

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. An exposure apparatus for exposing a pattern formed on a mask onto a photosensitive substrate, comprising:

an illumination optical system disposed in an optical path between a light source and the mask so as to guide light from the light source to the mask to be illuminated, said illumination optical system including a pupil; and a projection system disposed in an optical path between the mask and the photosensitive substrate so as to project an image of the pattern formed on the mask onto the photosensitive substrate, said projection system including an optical axis and a pupil;

wherein said illumination optical system includes:

a conjugate plane optically conjugate with respect to the mask;

a first optical system disposed in an optical path between said light source and said conjugate plane, said first optical system including a first optical axis; and a second optical system disposed in an optical path between said conjugate plane and the mask, said second optical system including a second optical axis that is shifted at said conjugate plane with respect to said first optical axis;

wherein the second optical axis coincides with the optical axis of said projection system, and wherein the pupil of said illumination optical system is conjugate with the pupil of said projection system.

2. An exposure apparatus according to claim 1, wherein said projection system is a catadioptric optical system.

3. An exposure apparatus according to claim 1, further comprising:
an optical integrator arranged within said first optical system s o as to illuminate said conjugate plane; and
a condenser optical system arranged within said second optical system so as to direct the light from said conjugate plane to the mask.

4. An exposure apparatus according to claim 3, wherein said optical integrator comprises a rod capable of internal reflection and having an exit surface that is substantially conjugate with said conjugate plane.

5. A method for manufacturing a semiconductor device, comprising the steps of:
illuminating a mask by using the illumination optical system of said exposure apparatus of claim 1; and
projecting an image of a pattern formed on the mask onto a photosensitive substrate.

6. A method for manufacturing a semiconductor device, comprising the steps of:
illuminating a mask by using the illumination optical system of said exposure apparatus of claim 2; and
projecting an image of a pattern formed on the mask onto a photosensitive substrate.

7. A method for manufacturing a semiconductor device, comprising the steps of:
illuminating a mask by using the illumination optical system of said exposure apparatus of claim 3; and
projecting an image of a pattern formed on the mask onto a photosensitive substrate.

8. A method for manufacturing a semiconductor device, comprising the steps of:
illuminating a mask by using the illumination optical system of said exposure apparatus of claim 4; and
projecting an image of a pattern formed on the mask onto a photosensitive substrate.

9. An exposure method, comprising the steps of:
illuminating a mask by using the illumination optical system of said exposure apparatus of claim 1; and
projecting an image of a pattern formed on the mask onto a photosensitive substrate.

10. An exposure method, comprising the steps of:
illuminating a mask by using the illumination optical system of said exposure apparatus of claim 2; and
projecting an image of a pattern formed on the mask onto a photosensitive substrate.

11. An exposure apparatus for exposing a pattern formed on a mask onto a photosensitive substrate, comprising:
an illumination optical system disposed in an optical path between a light source and the mask so as to guide light from the light source to the mask to be illuminated, said illumination optical system including a first optical axis and a first pupil;
an optical unit disposed within said illumination optical system so as to form an illumination region at a predetermined position along the mask, said illumination region being displaced from the first optical axis; and
a projection system disposed in an optical path between the mask and the photosensitive substrate so as to project an image of the pattern formed on the mask onto the photosensitive substrate, said projection system including a second optical axis and a second pupil;
wherein the first optical axis of said illumination optical system coincides with the second optical axis, and wherein the first pupil of said illumination optical system is conjugate with the second pupil of said projection system.

12. An exposure apparatus according to claim 11, wherein said projection system is a catadioptric optical system.

13. An exposure apparatus according to claim 11, wherein said illumination optical system includes an optical integrator; and
wherein said optical unit is disposed in an optical path between said optical integrator and the mask.

14. An exposure apparatus according to claim 13, wherein said illumination optical system further comprises a Fourier plane with respect to the mask, and wherein said optical unit is arranged near said Fourier plane.

15. An exposure apparatus according to claim 14, wherein:
said optical integrator is arranged within said illumination optical system so as to form a plurality of light sources at said Fourier plane; and further comprising:
a condenser optical system arranged within said illumination optical system so as to direct the light from said plurality of light sources to the mask; and
wherein said optical unit includes an optical element that deflects the light from said plurality of light sources.

16. An exposure apparatus according to claim 14, wherein said optical unit includes a wedge prism.

17. An exposure apparatus according to claim 13, wherein said optical unit includes a first folding member and a second folding member, and
wherein said illumination optical system further comprises a conjugate plane that is optically conjugate with the mask and arranged between said first folding member and said second folding member.

18. An exposure apparatus according to claim 13, wherein said optical unit includes a step-shaped optical member arranged adjacent to an exit surface of said optical integrator.

19. An exposure apparatus according to claim 11, wherein said optical unit includes an optical integrator having an exit surface that has a plurality of deflecting surfaces.

20. A method for manufacturing a semiconductor device, comprising the steps of:
illuminating a mask by using the illumination optical system of said exposure apparatus of claim 11; and
projecting an image of a pattern formed on the mask onto a photosensitive substrate.

21. A method for manufacturing a semiconductor device, comprising the steps of:
illuminating a mask by using the illumination optical system of said exposure apparatus of claim 12; and
projecting an image of a pattern formed on the mask onto a photosensitive substrate.

22. A method for manufacturing a semiconductor device, comprising the steps of:
illuminating a mask by using the illumination optical system of said exposure apparatus of claim 13; and
projecting an image of a pattern formed on the mask onto a photosensitive substrate.

23. A method for manufacturing a semiconductor device, comprising the steps of:
illuminating a mask by using the illumination optical system of said exposure apparatus of claim 14; and
projecting an image of a pattern formed on the mask onto a photosensitive substrate.

24. An exposure method, comprising the steps of:
illuminating a mask by using the illumination optical system of said exposure apparatus of claim 11; and projecting an image of a pattern formed on the mask onto a photosensitive substrate.

25. An exposure method, comprising the steps of:

illuminating a mask by using the illumination optical system of said exposure apparatus of claim 12; and projecting an image of a pattern formed on the mask onto a photosensitive substrate.

26. An exposure method, comprising the steps of:

illuminating a mask by using the illumination optical system of said exposure apparatus of claim 13; and projecting an image of a pattern formed on the mask onto a photosensitive substrate.

* * * * *